US006809665B2

(12) United States Patent
Park et al.

(10) Patent No.: US 6,809,665 B2
(45) Date of Patent: Oct. 26, 2004

(54) APPARATUS AND METHOD FOR DECODING VARIABLE LENGTH CODE

(75) Inventors: Tae-hwan Park, Gyeongsan (KR); Tae-sun Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/632,010

(22) Filed: Jul. 31, 2003

(65) Prior Publication Data

US 2004/0021593 A1 Feb. 5, 2004

(30) Foreign Application Priority Data

Aug. 3, 2002 (KR) .................................. 10-2002-0045975

(51) Int. Cl.⁷ .............................................. H03M 7/40
(52) U.S. Cl. ......................................... 341/67; 341/106
(58) Field of Search ....................... 341/67, 106; 380/46; 382/246

(56) References Cited

U.S. PATENT DOCUMENTS 5,226,082 A * 7/1993 Kustka .......................... 380/46
5,675,332 A * 10/1997 Limberg ........................ 341/67
5,784,631 A * 7/1998 Wise ........................... 382/246
5,841,380 A * 11/1998 Sita et al. ...................... 341/67
5,990,812 A * 11/1999 Bakhmutsky ................... 341/67

* cited by examiner

Primary Examiner—Jean Bruner Jeanglaude
(74) Attorney, Agent, or Firm—F. Chau & Associates LLC

(57) ABSTRACT

An apparatus and method for decoding a variable length code, wherein a user can set a variable length decoding table, are provided. The apparatus comprises a pre-decoding unit, a shifter, first through M-th look-up table address registers, selector, a memory controller, a memory, and a memory searcher. To decode a variable length coded data bitstream in units of 3 bits, a LOC information table can be prepared based on a variable length coding table. The LOC information table comprises LOC information bits and node types. LOC information bits for each node type are expressed using four formats A, B, C, and D to express the characteristic of a branch generated during 3-bit decoding, each of the formats A, B, C, and D having a digital value of 2 bits. The pre-decoding unit comprises a first pre-decoder and a second pre-decoder. One of the first pre-decoder and the second pre-decoder is selected according to the characteristic of a code of an input data bitstream.

19 Claims, 6 Drawing Sheets

| NODE TYPE | LOC INFORMATION BITS | | | | | | | |
|---|---|---|---|---|---|---|---|---|
| 0 Terminal Node | 11 | 10 | 10 | 10 | | | | |
| 1 Terminal Node | | | | | 11 | 10 | 10 | 10 |
| 00 Terminal Node | 11 | 10 | | | | | | |
| 01 Terminal Node | | | 11 | 10 | | | | |
| 10 Terminal Node | | | | | 11 | 10 | | |
| 11 Terminal Node | | | | | | | 11 | 10 |
| 000 Terminal Node | 11 | | | | | | | |
| 000 Continuous Node | 01 | | | | | | | |
| 000 Invalid Node | 00 | | | | | | | |
| 001 Terminal Node | | 11 | | | | | | |
| 001 Continuous Node | | 01 | | | | | | |
| 001 Invalid Node | | 00 | | | | | | |
| 010 Terminal Node | | | 11 | | | | | |
| 010 Continuous Node | | | 01 | | | | | |
| 010 Invalid Node | | | 00 | | | | | |
| 011 Terminal Node | | | | 11 | | | | |
| 011 Continuous Node | | | | 01 | | | | |
| 011 Invalid Node | | | | 00 | | | | |
| 100 Terminal Node | | | | | 11 | | | |
| 100 Continuous Node | | | | | 01 | | | |
| 100 Invalid Node | | | | | 00 | | | |
| 101 Terminal Node | | | | | | 11 | | |
| 101 Continuous Node | | | | | | 01 | | |
| 101 Invalid Node | | | | | | 00 | | |
| 110 Terminal Node | | | | | | | 11 | |
| 110 Continuous Node | | | | | | | 01 | |
| 110 Invalid Node | | | | | | | 00 | |
| 111 Terminal Node | | | | | | | | 11 |
| 111 Continuous Node | | | | | | | | 01 |
| 111 Invalid Node | | | | | | | | 00 |

| INDEX | SYMBOL | FIXED LENGTH CODE | VARIABLE LENGTH CODE |
|---|---|---|---|
| 0 | a | 000 | 10 |
| 1 | b | 001 | 111 |
| 2 | c | 010 | 00 |
| 3 | d | 011 | 0111 |
| 4 | e | 100 | 0110 |
| 5 | f | 101 | 010 |
| 6 | g | 110 | 110 |

HUFFMAN CODE TABLE (VLC TABLE)

FIG. 5

| ADDRESS | CONTENT (16 BITS) | | | | | | | | TERMINAL VALUE (8 BITS) |
|---|---|---|---|---|---|---|---|---|---|
| 0 | 11 | 10 | 11 | 01 | 11 | 10 | 11 | 11 | 0 |
| 1 | 11 | 10 | 10 | 10 | 11 | 10 | 10 | 10 | 5 |

FIG. 6

| ADDRESS | FIXED LENGTH CODE | SYMBOL |
|---|---|---|
| 0 | 010 | c |
| 1 | 101 | f |
| 2 | 000 | a |
| 3 | 110 | g |
| 4 | 001 | b |
| 5 | 100 | e |
| 6 | 011 | d |

APPARATUS AND METHOD FOR DECODING VARIABLE LENGTH CODE

CROSS-REFERENCE TO RELATED APPLICATIONS

This application claims priority to Korean Patent Application No. 2002-45975, filed on Aug. 3, 2002, which is herein incorporated by reference in its entirety.

BACKGROUND OF THE INVENTION

1. Field of the Invention

The present invention relates to a decoding apparatus, and more particularly, to an apparatus and method for decoding variable length coded data.

2. Description of the Related Art

The Moving Picture Experts Group (MPEG)2 standard, published in April of 1994, is an international standard for the compression and decompression of video.

Methods of compressing and decompressing video have been increasingly used in various applications such as for the transmission of digital image data and for digital storage devices. Image compression algorithms typically perform lossless compression of image data using a variable length encoder.

The variable length encoder assigns shorter bits to data symbols having a relatively high probability of occurrence and longer bits to data symbols having a relatively low probability of occurrence. Accordingly, when encoding a given data bitstream, the variable length encoder generates a shorter data bitstream than a fixed length encoder.

The variable length decoder detaches a variable length code corresponding to a single symbol from an input variable length coded data bitstream and obtains a fixed length code from the detached variable length code using a symbol table. If a variable length coding table used in the variable length encoder can be set by a user, the variable length decoder detaches variable length codes while reading fixed-length bits from an input data bitstream based on the variable length coding table used in the variable length encoder.

A method of detaching bits from an input data bitstream one by one and performing a tree search algorithm on each bit is a fundamental variable length decoding method. In the case of an MPEG bitstream, a typical maximum code length is 16 bits. For a code length of 16 bits, 16 tree searches need to be performed to obtain a code value. In another method, bits are detached in groups of two from an input data bitstream and a tree search algorithm is performed on each group of two bits. In this method, 8 tree searches need to be performed to obtain a code value given a code length of 16 bits.

As the number of bits detached from a data bitstream increases, decoding speed increases, but the structure of a decoder becomes increasingly complicated. Accordingly, an appropriate trade-off between decoding speed and the complexity of a decoder is needed.

Therefore, a need exists for a variable length decoder capable of handling a plurality of codes simultaneously.

SUMMARY OF THE INVENTION

The present invention provides an apparatus for decoding a variable length code, wherein L bits are detached from an input data bitstream and decoded. Pre-decoding methods are selectively used according to a characteristic of a code value of the input data bitstream.

The present invention provides a method of decoding a variable length code, wherein L bits are detached from an input data bitstream and decoded. Pre-decoding methods are selectively used according to a characteristic of a code value of the input data bitstream.

According to an embodiment of the present invention, there is provided an apparatus for decoding a variable length code comprising a pre-decoding unit, a shifter, first through M-th look-up table address registers, a selector, a memory controller, a memory, and a memory searcher. The pre-decoding unit receives a data bitstream and generates a first selection signal or a second selection signal for selecting a look-up table address register from a set of first through M-th look-up table address registers according to a code value of the data bitstream, where M is a natural number. The shifter shifts the data bitstream by a predetermined number of bits in response to one of the first selection signal and the second selection signal and a predetermined continuous node signal. Each of the first through M-th look-up table address registers includes a LOC (Local Codes) address designating a K-bit LOC table value stored in a memory, where K is a natural number. The selector selects an output of the first through M-th look-up table address registers and outputs the selected output in response to one of the first selection signal and the second selection signal. The memory controller receives the output of the selector, generates a third selection signal for selecting a LOC table value and a terminal value corresponding to the LOC table value in response to the predetermined continuous node signal, or generates a fourth selection signal for selecting a predetermined fixed length code stored in the memory in response to a predetermined symbol address signal, where the LOC table value and the terminal value are stored in the memory, and the terminal value is used to obtain a predetermined symbol address. The memory stores LOC table values, terminal values, and fixed length codes, outputs a LOC table value and a terminal value in response to the third selection signal, and outputs a fixed length code in response to the fourth selection code. The memory searcher receives the LOC table value and the terminal value that are output from the memory and L bits of the data bitstream, determines whether the L bits of the data bitstream designate a terminal node or a continuous node using a LOC information table stored therein, generates a continuous node signal or a symbol address signal based on the result of the determination, receives the fixed length code output from the memory, and outputs the fixed length code, where L is a natural number.

The pre-decoding unit includes a first pre-decoder and a second pre-decoder. The first pre-decoder receives the data bitstream and when sequential 0s or 1s exist in a set of most significant bits (MSBs) of the data bitstream, generates the first selection signal for selecting the look-up table address register from the set of first through M-th look-up table address registers according to the number of sequential 0s or 1s. The second pre-decoder receives the data bitstream and generates the second selection signal for selecting the look-up table address register from the set of first through M-th look-up table address registers using N bits in the MSBs of the data bitstream, where N is a natural number.

The shifter shifts the data bitstream by 3 bits in response to the continuous node signal.

The memory controller includes an offset register, an adder, a LOC address register, and a symbol address register. The offset register receives the output of the selector and stores it until a next output is received from the selector. The adder generates the third selection signal for selecting values from a LOC table stored in the memory by adding the output of the offset register and a predetermined next LOC address. The LOC address register generates the predetermined next LOC address in response to the continuous node signal. The symbol address register generates the fourth selection signal for selecting the fixed length code in response to the symbol address signal.

The next LOC address is a sum of a current LOC address and a number of non-terminal nodes in a current LOC up to a current node.

The symbol address is a sum of a terminal value corresponding to a current LOC table value and a number of terminal nodes in a current LOC before a current node.

The LOC information table stored in the memory searcher includes node types indicating whether a node designated by the variable length code is a terminal node, a continuous node, or an invalid node, each node type comprising $N*2^L$ LOC information bits, and LOC information bits for each node type are expressed using four formats A, B, C, and D. Each format comprises N bits.

In the LOC information table stored in the memory searcher, a node type designated by the variable length code is a terminal node when the variable length code is 0, 1, 00, 01, 10, or 11, and a node type designated by the variable length code is one of the terminal node, the continuous node, and the invalid node when the variable length code is one of 000 through 111. Here, in a case where N is 2 and L is 3, when the variable length code is 0, an upper 8 bits of the LOC information bits are expressed as ABBB. When the variable length code is 1, a lower 8 bits of the LOC information bits are expressed as ABBB. When the variable length code is 00, an upper 4 bits of the LOC information bits are expressed as AB. When the variable length code is 01, LOC information bits from an upper fifth to eighth places are expressed as AB. When the variable length code is 10, LOC information bits from an upper ninth to twelfth places are expressed as AB. When the variable length code is 11, LOC information bits from an upper thirteenth to sixteenth places are expressed as AB. When the variable length code is one of 000 through 111, LOC information bits for a terminal node designated by the variable length code are expressed as A, LOC information bits for a continuous node designated by the variable length code are expressed as C, and LOC information bits for an invalid node designated by the variable length code are expressed as D.

In the LOC information table stored in the memory searcher, a node type designated by the variable length code is the terminal node when the variable length code is 0 or 1, and a node type designated by the variable length code is one of the terminal node, the continuous node, and the invalid node when the variable length code is one of 00 through 11. Here, in a case where N is 2 and L is 2, when the variable length code is 0, the upper 4 bits among LOC information bits are expressed as AB. When the variable length code is 1, a lower 4 bits among LOC information bits are expressed as AB. When the variable length code is one of 00 through 11, LOC information bits for a terminal node designated by the variable length code are expressed as A, LOC information bits for a continuous node designated by the variable length code are expressed as C, and LOC information bits for an invalid node designated by the variable length code are expressed as D.

Each LOC table value stored in the memory comprises LOC information bits corresponding to node types designated by each variable length code of a current LOC in the LOC information table.

According to another embodiment of the present invention, there is provided a method of decoding a variable length code using a variable length code decoding apparatus, which includes first through M-th look-up table address registers each including a predetermined LOC address; a memory storing a LOC table, which comprises K-bit LOC table values corresponding to each LOC address and predetermined terminal values corresponding to each LOC address, and fixed length codes; and a memory searcher storing a LOC information table comprising information referred to for decoding a variable length code, where M is a natural number and K is a natural number. The method includes (a) receiving a data bitstream and generating one of a first selection signal and a second selection signal for selecting a look-up table address register from a set of first through M-th look-up table address registers according to a code value of the data bitstream; (b) selecting an output of the first through M-th look-up table address registers in response to one of the first selection signal and the second selection signal; (c) generating a third selection signal for selecting a LOC table value and a terminal value corresponding to the LOC table value from the LOC table stored in the memory by adding the output selected in (b) and a predetermined next LOC address, the terminal value being used to obtain a predetermined symbol address; (d) selecting a LOC table value and a terminal value from the LOC table in response to the third selection signal; (e) determining whether L bits of the data bitstream designates a terminal node or a continuous node using the LOC information table based on the selected LOC table value and the selected terminal value, which are output from the memory, to generate a continuous node signal or a symbol address signal, wherein L is a natural number; (f) generating the predetermined next LOC address used for selecting the LOC table value in response to the continuous node signal; (g) generating a fourth selection signal for selecting a fixed length code in response to the symbol address signal; and (h) selecting a fixed length code from the memory and outputting the fixed length code, in response to the fourth selection signal.

Receiving a data bitstream and generating one of the first selection signal and the second selection signal for selecting the look-up table address register from the set of first through M-th look-up table address registers according to a code value of the data bitstream comprises, (a1) when sequential 0s or 1s exist in a set of most significant bits (MSBs) of the data bitstream, generating the first selection signal for selecting the look-up table address register from the set of first through M-th look-up table address registers according to the number of sequential 0s or 1s; (a2) generating the second selection signal for selecting the look-up table address register from the set of first through M-th look-up table address registers using N bits in the MSBs of the data bitstream, wherein N is a natural number; and (a3) shifting the data bitstream by a predetermined number of bits in response to one of the first selection signal and the second selection signal and the continuous node signal.

The next LOC address is a sum of a current LOC address and a number of non-terminal nodes in a current LOC up to a current node.

The symbol address is a sum of a terminal value corresponding to a current LOC table value and a number of terminal nodes in a current LOC before a current node.

The LOC information table stored in the memory searcher includes node types indicating whether a node designated by a variable length code is a terminal node, a continuous node, or an invalid node, each node type comprising $N*2^L$ LOC information bits, and LOC information bits for each node type are expressed using four formats A, B, C, and D. Each format comprising N bits.

Each LOC table value stored in the memory comprises LOC information bits corresponding to node types designated by each variable length code of a current LOC in the LOC information table.

BRIEF DESCRIPTION OF THE DRAWINGS

The above and other features and advantages of the present invention will become more apparent by describing in detail preferred embodiments thereof with reference to the attached drawings in which:

FIG. 2 shows a LOC information table stored in a memory searcher shown in FIG. 1;

FIG. 5 is a table showing LOC table values and terminal values, which are stored in a memory shown in FIG. 1;

FIG. 6 is a table showing symbols and fixed length codes;

DETAILED DESCRIPTION OF PREFERRED EMBODIMENTS

Figure 1:
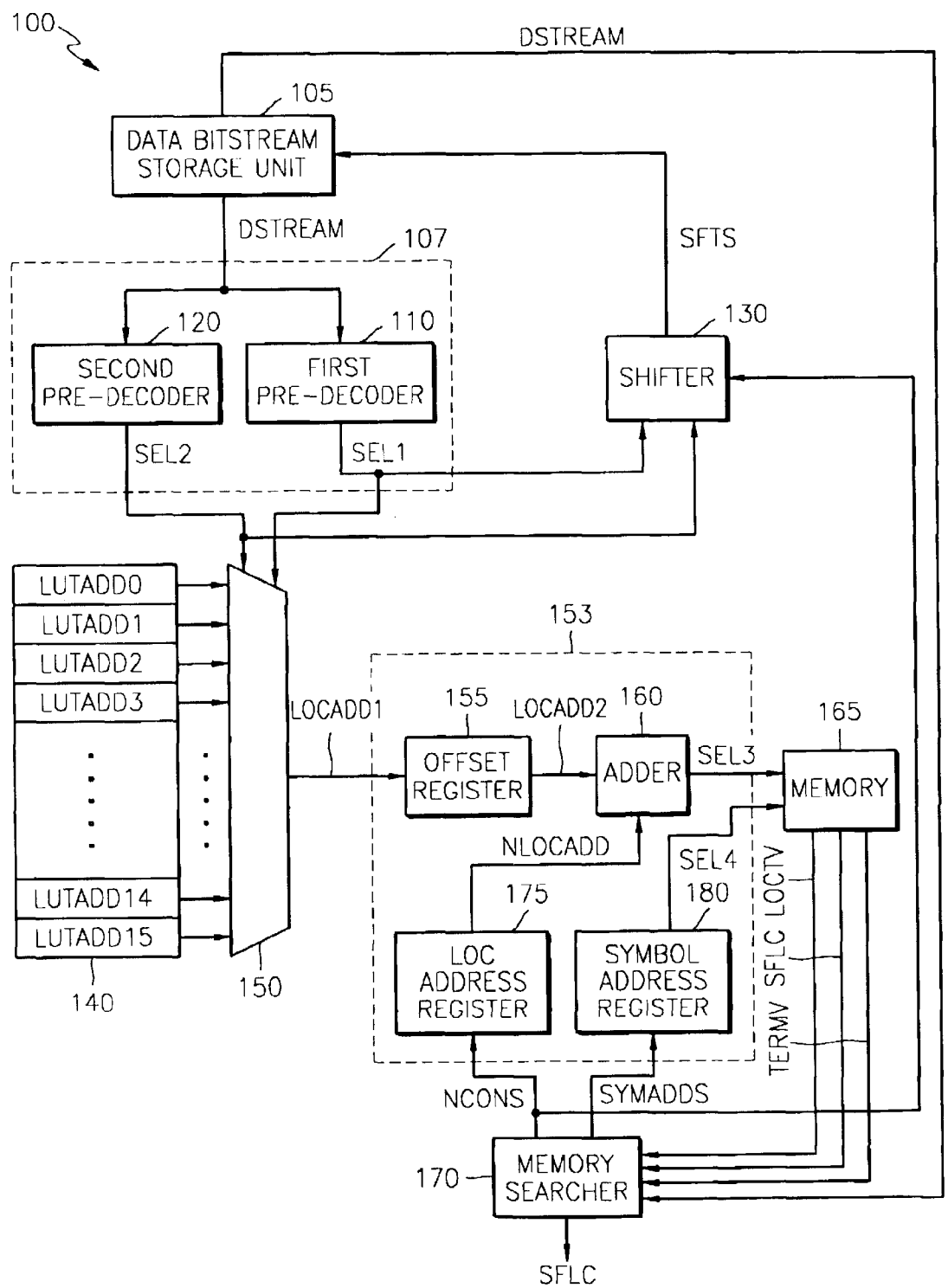
FIG. 1 is a diagram of an apparatus for decoding a variable length code according to an embodiment of the present invention.

Hereinafter, preferred embodiments of the present invention will be described in detail with reference to the attached drawings. In the drawings, the same reference numeral denotes the same element.

FIG. 1 is a diagram of an apparatus for decoding a variable length code according to an embodiment of the present invention. Referring to FIG. 1, the apparatus 100 for decoding a variable length code includes a pre-decoding unit 107, a shifter 130, first through M-th look-up table address registers 140, where M is a natural number, a selector 150, a memory control unit 153, a memory 165, and a memory searcher 170.

The pre-decoding unit 107 receives a data bitstream DSTREAM and generates a first selection signal SEL1 or a second selection signal SEL2 for selecting a look-up table address register from a set of first through M-th look-up table address registers 140 according to a code value of the data bitstream DSTREAM. The pre-decoding unit 107 includes a first pre-decoder 110 and a second pre-decoder 120.

The first pre-decoder 110 receives the data bitstream DSTREAM and generates the first selection signal SEL1 for selecting the look-up table address register from the set of first through M-th look-up table address registers 140 according to a number of 0s or 1s when sequential 0s or 1s exist in a set of most significant bits (MSBs) of the data bitstream DSTREAM. The second pre-decoder 120 receives the data bitstream DSTREAM and generates the second selection signal SEL2 for selecting the look-up table address register from the set of first through M-th look-up table address registers 140 using N bits (where N is a natural number) in the most significant bits (MSBs) of the data bitstream DSTREAM.

The shifter 130 shifts the data bitstream DSTREAM by a predetermined number of bits in response to the first selection signal SEL1 or the second selection signal SEL2 and a continuous node signal NCONS. More specifically, the shifter 130 shifts the data bitstream DSTREAM by L bits, where L is a natural number, in response to the continuous node signal NCONS. Here, L may be 3.

The first through M-th look-up table address registers 140 respectively have LOC addresses designating a LOC table value LOCTV stored in the memory 165 for K bits, where K is a natural number.

The selector 150 selects an output of the first through M-th look-up table address registers 140 and outputs the selected output in response to the first selection signal SEL1 or the second selection signal SEL2. The selector 150 may be a multiplexer.

The memory control unit 153 receives the output of the selector 150 and generates a third selection signal SEL3 for selecting a LOC table value LOCTV and a terminal value TERMV in response to the continuous node signal NCONS or generates a fourth selection signal for selecting a predetermined fixed length code SFLC in response to a predetermined symbol address signal SYMADDS. The LOC table value LOCTV, the terminal value TERMV, and the predetermined fixed length code SFLC are stored in the memory 165.

More specifically, the memory control unit 153 includes an offset register 155, an adder 160, a LOC address register 175, and a symbol address register 180.

The offset register 155 receives the output of the selector 150. The output of the selector 150 is stored in the offset register 155 until a next output is received from the selector 150.

The adder 160 adds the output of the offset register 155 and a predetermined next LOC address NLOCADD to generate the third selection signal SEL3 for selecting the LOC table value LOCTV and the terminal value TERMV, which are stored in the memory 165.

The LOC address register 175 generates the next LOC address NLOCADD for selecting the LOC table value LOCTV, in response to the continuous node signal NCONS. The next LOC address NLOCADD is a sum of a current LOC address and a number of non-terminal nodes in a current LOC up to a current node.

The symbol address register 180 generates the fourth selection signal SEL4 for obtaining the fixed length code SFLC, in response to the symbol address signal SYMADDS. A symbol address is a sum of a terminal value TERMV corresponding to the current LOC table value LOCTV and a number of terminal nodes in a current LOC before the current node.

The memory 165 stores LOC table values LOCTV, predetermined terminal values TERMV, and fixed length codes SFLC. The memory 165 outputs a particular LOC table value LOCTV and a particular terminal value TERMV in response to the third selection signal SEL3 or outputs a particular fixed length code SFLC in response to the fourth selection signal SEL4. Each of the LOC table values LOCTV stored in the memory 165 comprises LOC information bits corresponding to node types designated by each variable length code of a current LOC in a LOC information table, for example, table 200 shown in FIG. 2.

The memory searcher 170 receives a particular LOC table value LOCTV and a particular terminal value TERMV from the memory 165 and L bits of the data bitstream DSTREAM. Thereafter, the memory searcher 170 determines whether the L bits of the data bitstream DSTREAM are for a terminal node or a continuous node using the LOC information table 200 stored therein and generates the continuous node signal NCONS or the symbol address signal SYMADDS. Here, L is a natural number and may be 3. In addition, the memory searcher 170 receives the fixed length code SFLC from the memory 165 and outputs it.

The LOC information table 200 stored in the memory searcher 170 includes node types indicating whether a node designated by a variable length code is a terminal node, a continuous node, or an invalid node. Each node type comprises $N*2^L$ LOC information bits. LOC information bits for each node type can be expressed using four formats, A, B, C, and D. Each format comprises N bits.

In the LOC information table 200 stored in the memory searcher 170, when a variable length code is 0, 1, 00, 01, 10, or 11, a node type designated by the variable length code is a terminal node. When a variable length code is one of 000 through 111, a node type designated by the variable length code can be a terminal node, a continuous node, or an invalid node. For example, where N is 2 and L is 3, when a variable length code is 0, an upper 8 bits of the LOC information bits are expressed as ABBB. When a variable length code is 1, a lower 8 bits of the LOC information bits are expressed as ABBB. When a variable length code is 00, an upper 4 bits of the LOC information bits are expressed as AB. When a variable length code is 01, the LOC information bits from an upper fifth to eighth places are expressed as AB. When a variable length code is 10, the LOC information bits from an upper ninth to twelfth places are expressed as AB. When a variable length code is 11, the LOC information bits from an upper thirteenth to sixteenth places are expressed as AB. In a case where a variable length code is one of 000 through 111, when the variable length code designates a terminal node, the LOC information bits are expressed as A. When the variable length code designates a continuous node, the LOC information bits are expressed as C. When the variable length code designates an invalid node, the LOC information bits are expressed as D.

In another example of a LOC information table stored in the memory searcher 170, when a variable length code is 0 or 1, a node type designated by the variable length code is a terminal node. When a variable length code is one of 00 through 11, a node type designated by the variable length code can be a terminal node, a continuous node, or an invalid node.

According to the LOC information table, where for example, N is 2 and L is 2, when a variable length code is 0, the upper 4 bits among LOC information bits are expressed as AB. When a variable length code is 1, a lower 4 bits among LOC information bits are expressed as AB. In a case where a variable length code is one of 00 through 11 and the variable length code designates a terminal node, the LOC information bits are expressed as A. When the variable length code designates a continuous node, the LOC information bits are expressed as C. When the variable length code designates an invalid node, the LOC information bits are expressed as D.

Figures 3, 4:
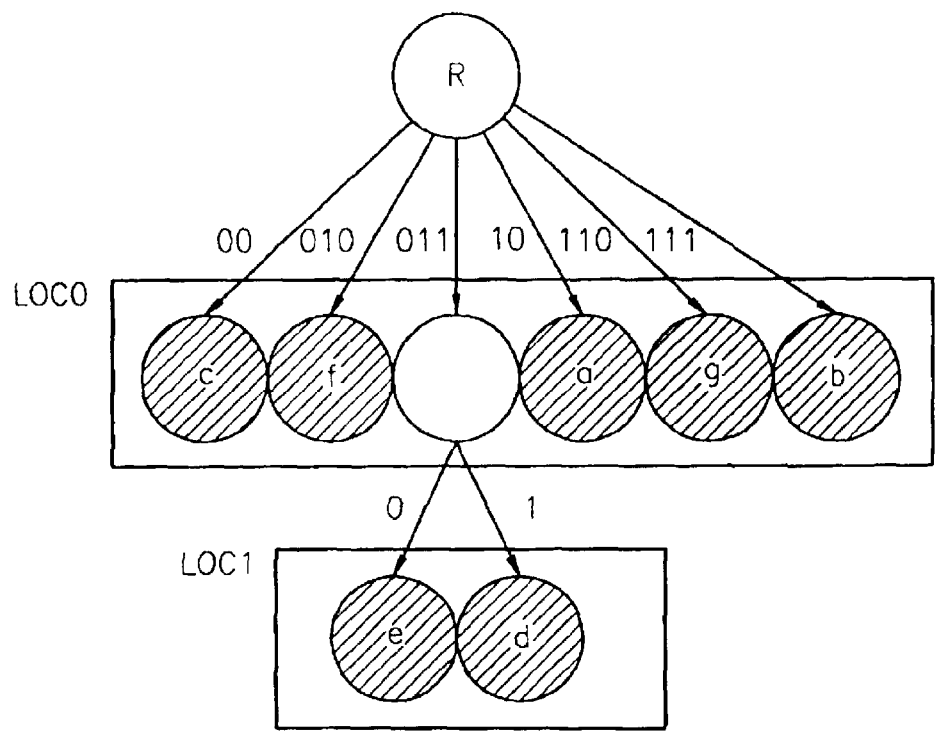
FIG. 3 is a table showing symbols and variable length codes.
FIG. 4 is a diagram showing a procedure for obtaining a symbol from a variable length code according to an embodiment of the present invention.

FIG. 2 shows the LOC information table 200 stored in the memory searcher 170 shown in FIG. 1. FIG. 3 is a table showing symbols and variable length codes. FIG. 4 is a conceptual diagram showing a procedure for obtaining a symbol from a variable length code. FIG. 5 is a table showing LOC table values and terminal values, which are stored in the memory 165 shown in FIG. 1. FIG. 6 is a table showing symbols and fixed length codes.

Hereinafter, the operations of the apparatus 100 for decoding a variable length code according to an embodiment of the present invention will be described in detail with reference to FIGS. 1 through 6.

The data bitstream DSTREAM is stored in the data bitstream storage unit 105. The pre-decoding unit 107 receives the data bitstream DSTREAM from the data bitstream storage unit 105. The data bitstream DSTREAM is data information obtained by encoding data using variable length codes.

The data bitstream DSTREAM will be described in detail with reference to FIG. 3. Symbols can be encoded using fixed length codes or variable length codes. When symbols are encoded using fixed length codes, the same number of bits is assigned to all symbols. When symbols are encoded using variable length codes, different numbers of bits are assigned to different symbols. For example, in variable length codes a smaller number of bits are assigned to symbols having a relatively high probability of occurrence, and a larger number of bits are assigned to symbols having a relatively low probability of occurrence, and the number of bits of encoded data can be reduced as compared to fixed length codes. Accordingly, variable length codes are more widely used for encoding than fixed length codes. According to an embodiment of the present invention, a data bitstream has been encoded using variable length codes.

The pre-decoding unit 107 includes the first pre-decoder 110 and the second pre-decoder 120. When sequential 0s or 1s exist in the MSBs of the data bitstream DSTREAM, as in a direct current (DC) coefficient table as defined by the MPEG standard and the Joint Photographic Experts Group (JPEG) standard, the first pre-decoder 110 generates the first selection signal SEL1 for selecting a look-up table address register from a set of the first through M-th look-up table address registers 140 according to the number of 0s or 1s. For example, when two sequential 0s or 1s exist in the MSBs of the data bitstream DSTREAM, the first selection signal SEL1 selects the first look-up table address register LUTADD0. When three or four sequential 0s or 1s exist in the MSBs of the data bitstream DSTREAM, the first selection signal SEL1 selects the second look-up table address register LUTADD1. Thus, one of the first through M-th look-up table address registers 140 is selected according to the characteristic of the data bitstream DSTREAM.

When no sequential 0s or 1s exist, as in an alternating current (AC) coefficient table defined by the MPEG standard, the second pre-decoder 120 generates the second selection signal SEL2 for selecting the look-up table address register from the set of the first through M-th look-up table address registers 140 using several bits in the MSBs of the data bitstream DSTREAM. For example, when using four bits in the MSBs, the second selection signal SEL2 selects the first look-up table address register LUTADD0 if the four bits are 0000, selects the second look-up table address register LUTADD1 if the four bits are 0001, and selects the third look-up table address register LUTADD2 if the four bits are 0010. Thus, one of the first through M-th look-up table address registers 140 is selected according to the characteristic of the data bitstream DSTREAM.

As described above, by separately providing the first pre-decoder 110 and the second pre-decoder 120, the size of data to be decoded is reduced according to the characteristic of a code value of the data bitstream DSTREAM.

Consequently, power consumption is reduced, and a decoding speed is increased. The data bitstream DSTREAM is input to one of the first pre-decoder 110 and the second pre-decoder 120 based on data bitstream DSTREAM information, which has been detected and input to a control register (not shown) by a user.

The shifter 130 shifts the data bitstream DSTREAM in response to the first selection signal SEL1 or the second selection signal SEL2. If the second pre-decoder 120 determines the characteristic of a code value of the data bitstream DSTREAM in units of four bits of the code value, the shifter 130 shifts the data bitstream DSTREAM by four bits in response to the second selection signal SEL2.

The shifter 130 shifts the data bitstream DSTREAM by L bits in response to the continuous node signal NCONS. According to an embodiment of the present invention, L may be 3.

Each of the first through M-th look-up table address registers 140 includes a LOC address designating a K-bit LOC table value LOCTV stored in the memory 165.

Referring to FIG. 5, LOC addresses are 0 and 1 shown in an address section. LOC table values LOCTV are values shown in a content section. For example, the LOC address 0 corresponds to the 16 bits 11 10 11 01 11 10 11 11 stored as a K-bit LOC table value LOCTV. LOC table values LOCTV are stored in the memory 165, and a LOC address designating a LOC table value LOCTV is stored in each of the first through M-th look-up table address registers 140.

The selector 150 selects an output of the first through M-th look-up table address registers 140 in response to the first selection signal SEL1 or the second selection signal SEL2. The selector 150 may be a multiplexer.

When the data bitstream DSTREAM is input to the second pre-decoder. 120, the second selection signal SEL2 is generated, and one of the LOC addresses stored in the first through M-th look-up table address registers 140 is selected in response to the second selection signal SEL2. The LOC address selected in response to the second selection signal SEL2 is input to the memory controller 153. The memory controller 153 selects a LOC table value LOCTV corresponding to the input LOC address.

After the data bitstream DSTREAM is pre-decoded according to the code characteristic thereof and an LOC address is selected, the data bitstream DSTREAM is decoded using a tree search method. The tree search method is performed based on a LOC. An operation of decoding the data bitstream DSTREAM will be described in detail with reference to FIG. 4.

A LOC is a group of child nodes connected to a single node. A node is a data symbol that is output as the result of a decoding operation. Nodes include terminal nodes and continuous nodes. A terminal node is a final data symbol, and a continuous node is an intermediate node in a path to a terminal node. In FIG. 4, hatched circles denote terminal nodes, and a blank circle denotes a continuous node.

Pre-decoding is performed according to the characteristic of a code value of the input data bitstream DSTREAM and a LOC address is selected. Here, the characteristic of a code value of the data bitstream DSTREAM can be determined based on either 4 or 5 bits of the data bitstream DSTREAM. However, decoding of the data bitstream DSTREAM is performed in units of L bits. By way of example and for clarity of the description, L is 3, that is, the data bitstream DSTREAM is decoded in units of 3 bits.

During decoding, the apparatus 100 for decoding a variable length code shown in FIG. 1 receives data bitstream DSTREAM in units of 3 bits and determines whether each 3 bits of the data bitstream DSTREAM is a terminal node or a continuous node using the LOC information table 200 shown in FIG. 2.

The LOC information table 200 shown in FIG. 2 includes node types indicating whether a node designated by a variable length code is a terminal node, a continuous node, or an invalid node, and LOC information bits identifying each node type. According to the example, the variable length code is the code value of each 3 bits of the data bitstream DSTREAM. In FIG. 2, numerals in each node type section correspond to a 3-bit data bitstream DSTREAM.

Each node type comprises $N*2^L$ LOC information bits. LOC information bits for each node type can be expressed using four formats A, B, C, and D, wherein each format comprises N bits.

In the LOC information table 200 shown in FIG. 2, LOC information bits are expressed using four formats A, B, C, and D, each comprising 2 bits. For example, the format A is expressed as 11, the format B is expressed as 10, the format C is expressed as 01, and the format D is expressed as 00. Here, N is 2. However, N is not restricted to 2. In the description below, 11, 10, 01, and 00 are used instead of A, B, C, and D. Thus, according to the example, N=2 and L=3. Accordingly, each node type has $2*2^3=16$ LOC information bits.

When the MSB of a 3-bit data bitstream DSTREAM is 0 and LOC table values stored in the memory 165 are the same as LOC information bits in the LOC information table 200, the MSB 0 of a 3-bit data bitstream DSTREAM is a terminal node.

Referring to the LOC information table 200 shown in FIG. 2, when a 3-bit data bitstream DSTREAM includes 0, 1, 00, 01, 10, or 11, a node type designated by the 3-bit data bitstream DSTREAM is a terminal node. When a 3-bit data bitstream DSTREAM is one of 000 through 111, a node type designated by the 3-bit data bitstream DSTREAM can be a terminal node, a continuous node, or an invalid node according to LOC information bits. Each terminal node, continuous node, and invalid node has 16 LOC information bits.

When the MSB of a 3-bit data bitstream DSTREAM is 0 and designates a terminal node, the <0> terminal node has 11 10 10 10 in the upper 8 LOC information bits. When the MSB of a 3-bit data bitstream DSTREAM is 1 and designates a terminal node, the <1> terminal node has 11 10 10 10 in the lower 8 LOC information bits. When the upper 2 bits of a 3-bit data bitstream DSTREAM are 00 and designates a terminal node, the <00> terminal node has 11 10 in the upper 4 LOC information bits. When the upper 2 bits of a 3-bit data bitstream DSTREAM are 01 and designate a terminal node, the <01> terminal node has 11 10 in the fifth through eighth places in LOC information bits, respectively. When the upper 2 bits of a 3-bit data bitstream DSTREAM are 10 and designate a terminal node, the <10> terminal node has 11 10 in the ninth through twelfth places in LOC information bits, respectively. When the upper 2 bits of a 3-bit data bitstream DSTREAM are 11 and designate a terminal node, the <11> terminal node has 11 10 in the thirteenth through sixteenth places in LOC information bits, respectively.

When a 3-bit data bitstream DSTREAM is one of 000 through 111 and designates a terminal node, the terminal node has 11 in LOC information bits. When a 3-bit data bitstream DSTREAM is one of 000 through 111 and designates a continuous node, the continuous node has 01 in LOC information bits. When a 3-bit data bitstream DSTREAM is one of 000 through 111 and designates an invalid node, the terminal node has 00 in LOC information bits.

LOC table values LOCTV, stored in the memory 165, are obtained using the conceptual diagram shown in FIG. 4 and the LOC information table 200 shown in FIG. 2.

Referring to FIG. 4, an input data bitstream DSTREAM including 00 designates a terminal node "c". It can be inferred from the LOC information table 200 shown in FIG. 2 that LOC information bits for the terminal node "c" are 11 10. This value 11 10 is recorded in the content section indicating a LOC table value LOCTV in a LOC table shown in FIG. 5. An input data bitstream DSTREAM 010 designates a terminal node "f". It can be inferred from the LOC information table 200 shown in FIG. 2 that LOC information bits for the terminal node "f" are 11. This value 11 is recorded behind 11 10 in the content section of the LOC table. An input data bitstream DSTREAM 011 designates a continuous node. It can be inferred from the LOC information table 200 shown in FIG. 2 that LOC information bits for the continuous node are 01. This value 01 is recorded behind 11 10 11 in the content section of the LOC table. An input data bitstream DSTREAM including 10 designates a terminal node "a". It can be inferred from the LOC information table 200 shown in FIG. 2 that LOC information bits for the terminal node "a" are 11 10. This value 11 10 is recorded behind 11 10 11 01 in the content section of the LOC table. An input data bitstream DSTREAM 110 designates a terminal node "g". It can be inferred from the LOC information table 200 shown in FIG. 2 that LOC information bits for the terminal node "g" are 11. This value 11 is recorded behind 11 10 11 01 11 10 in the content section of the LOC table. An input data bitstream DSTREAM 111 designates a terminal node "b". It can be inferred from the LOC information table 200 shown in FIG. 2 that LOC information bits for the terminal node "b" are 11. This value 11 is recorded behind 11 10 11 01 11 10 11 in the content section of the LOC table. Then, a LOC table value corresponding to a LOC0 is completed. A LOC address 0 corresponds to LOC0, and a LOC address 1 corresponds to LOC1. LOC table values LOCTV for respective variable length codes 0 and 1 shown at the branches from the continuous node of the LOC0 to the LOC1 can be obtained.

In FIG. 4, a reference character R denotes a root node. Branches are connected from the root node R to the LOC0, and each branch has input data bitstream DSTREAM expressed in the form of a variable length code. Variable length codes are shown in FIG. 3.

When a variable length code is 4 bits in length, the first three bits designate a continuous node and the last one bit designates a terminal node connected to the continuous node.

The variable length codes shown in FIG. 3 are examples, and are not intended to be limiting. For example, a variable length code designating a symbol "a" can be a different code node, not shown in FIG. 3. If the variable length codes shown in FIG. 3 change, the conceptual diagram shown in FIG. 4 also changes.

FIG. 5 shows the LOC table including LOC table values LOCTV, which is stored in the memory 165. Each numeral written in the address section denotes a LOC address stored in one of the first through M-th look-up table address registers 140.

An input data bitstream DSTREAM may have various code values. If the 3 bits of the input data bitstream DSTREAM are not one of 00, 010, 011, 10, 110, and 111 shown in FIG. 4, the input data bitstream DSTREAM comprises an error and is processed using an interrupt.

In the following example, the data bitstream DSTREAM is given by 011000 . . . .

If the selector 150 outputs a LOC address 0 in response to the first selection signal SEL1 or the second selection signal SEL2, the LOC address value 0 is stored in the offset register 155.

A LOC table value LOCTV corresponding to the LOC address 0 is selected from the LOC table stored in the memory 165. The selected LOC table value LOCTV is 11 10 11 01 11 10 11 11, and a first 3-bit data bitstream DSTREAM is 011. Referring to the LOC table values LOCTV, input data bitstream DSTREAM is valid when it is any one of 00, 010, 011, 10, 110, and 111. Here, since the first 3-bit data bitstream DSTREAM is 011, it is valid. As shown in FIG. 4, the data bitstream DSTREAM 011 designates a continuous node, and thus the memory searcher 170 generates the continuous node signal NCONS.

The LOC address register 175 of the memory controller 153 receives the continuous node signal NCONS and generates a next LOC address NLOCADD. A next LOC address NLOCADD is the sum of a current LOC address and the number of non-terminal nodes in a current LOC up to the current node. Here, a current LOC address is 0, and the number of non-terminal nodes in a current LOC up to the current node is 1. The current node <011> is a continuous node. Accordingly, the next LOC address NLOCADD is 1.

The shifter 130 shifts the input data bitstream DSTREAM by 3 bits in response to the continuous node signal NCONS. Accordingly, the data bitstream DSTREAM is 000. The adder 160 adds the value 0 stored in the offset register 155 and the LOC address 1 so as to output 1 as the third selection signal SEL3.

The LOC address 0, initially stored in the offset register 155, is kept until the data bitstream DSTREAM designates a terminal node that is decoded into a symbol value. If the input data bitstream DSTREAM is decoded into a symbol value, a new LOC address is selected by the first pre-decoder 110 or the second pre-decoder 120 and stored in the offset register 155.

A LOC table value LOCTV corresponding to the LOC address 1 is selected from the LOC table stored in the memory 165 in response to the third selection signal SEL3. The LOC table value LOCTV is applied to the memory searcher 170. In addition, a terminal value TERMV is selected from the LOC table stored in the memory 165 in response to the third selection signal SEL3.

The memory searcher 170 receives the LOC table value LOCTV and the terminal value TERMV, which are output from the memory 165, and the 3-bit input data bitstream DSTREAM. The LOC table value LOCTV is 11 10 10 10 11 10 10 10, and the 3-bit input data bitstream DSTREAM is 000. Referring to the LOC table value LOCTV, an input data bitstream DSTREAM is valid when it is 0 or 1. Here, the first bit 0 of the 3-bit input data bitstream DSTREAM 000 is a valid input value. As is seen from FIG. 4, the valid data bitstream 0 designates a terminal node. It can be inferred from FIG. 5 that the terminal value TERMV is 5. The terminal value TERMV is stored in the memory 165. The terminal value TERMV is the number of terminal nodes before the current LOC1 corresponding to the LOC address 1. Accordingly, the terminal value TERMV is 5. When the LOC address is 0, the terminal value TERMV is 0.

The memory searcher 170 receives the terminal value TERMV output from the memory 165, selects a symbol address stored therein, and generates a symbol address signal SYMADDS corresponding to the selected symbol address.

A symbol address is the sum of a terminal value TERMV corresponding to a current LOC table value LOCTV and the number of terminal nodes in a current LOC before a current node. Here, the terminal value TERMV corresponding to the current LOC table value LOCTV is 5, and the number of terminal nodes in the current LOC1 before the <0> current node is zero. Thus, the symbol address is 5.

FIG. 6 shows symbol addresses, symbols, and fixed length codes. Since the symbol address is 5, the memory searcher 170 generates a symbol address signal SYMADDS for selecting a symbol "e".

The symbol address register 180 stores the symbol address signal SYMADDS and generates the fourth selection signal SEL4 for selecting a fixed length code SFLC.

The fourth selection signal SEL4 is applied to the memory 165 so that a fixed length code SFLC corresponding to the symbol "e" is output from the memory 165.

The memory searcher 170 receives and outputs the fixed length code SFLC output from the memory 165.

As described above, the apparatus 100 for decoding a variable length code according to an embodiment of the present invention can decode a data bitstream DSTREAM that has been encoded using variable length codes in units of 3 bits, thereby increasing a decoding speed. In addition, by using the first pre-decoder 110 and the second pre-decoder 120, the size of a table used for decoding according to the characteristic of a code value of an input data bitstream can be reduced, thereby reducing power consumption.

To decode data bitstream DSTREAM in units of 3 bits, a table having a structure as shown in the LOC information table of FIG. 2 needs to be prepared. The formats A, B, C, and D used to express LOC information bits in the LOC information table of FIG. 2 are each represented with a 2-bit digital value. However, a digital value for the formats A, B, C, and D is not restricted to 2 bits in length.

The data bitstream DSTREAM can be decoded in units of 2 bits. Here, if the formats A, B, C, and D have 2 bits in length, that is, N is 2, $2*2^2=8$ LOC information bits are used for each node type. In this case, the LOC information table of FIG. 2 can be changed as follows. When a variable length code is 0 or 1, a node type designated by the variable length code is a terminal node. When a variable length code is one of 00 through 11, a node type designated by the variable length code can be a terminal node, a continuous node, or an invalid node. When a variable length code is 0, the upper 4 bits in the LOC information bits are expressed as AB. When a variable length code is 1, the lower 4 bits in the LOC information bits are expressed as AB. In a case where a variable length code is one of 00 through 11, when a node type designated by the variable length code is a terminal node, the LOC information bits are expressed as A; when a node type designated by the variable length code is a continuous node, the LOC information bits are expressed as C; and when a node type designated by the variable length code is an invalid node, the LOC information bits are expressed as D.

Figure 7:
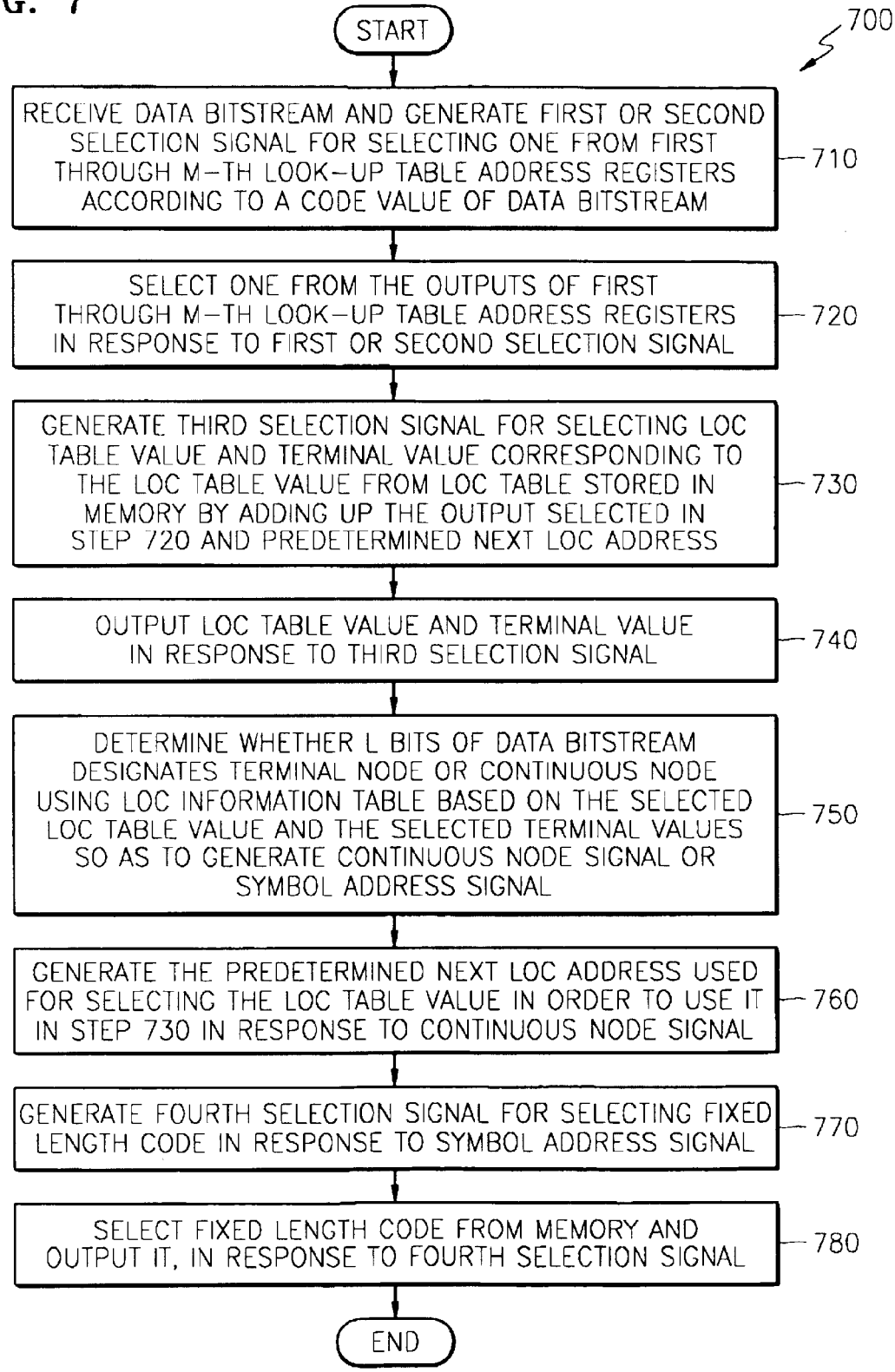
FIG. 7 is a flowchart of a method of decoding a variable length code according to an embodiment of the present invention.
Figure 8:
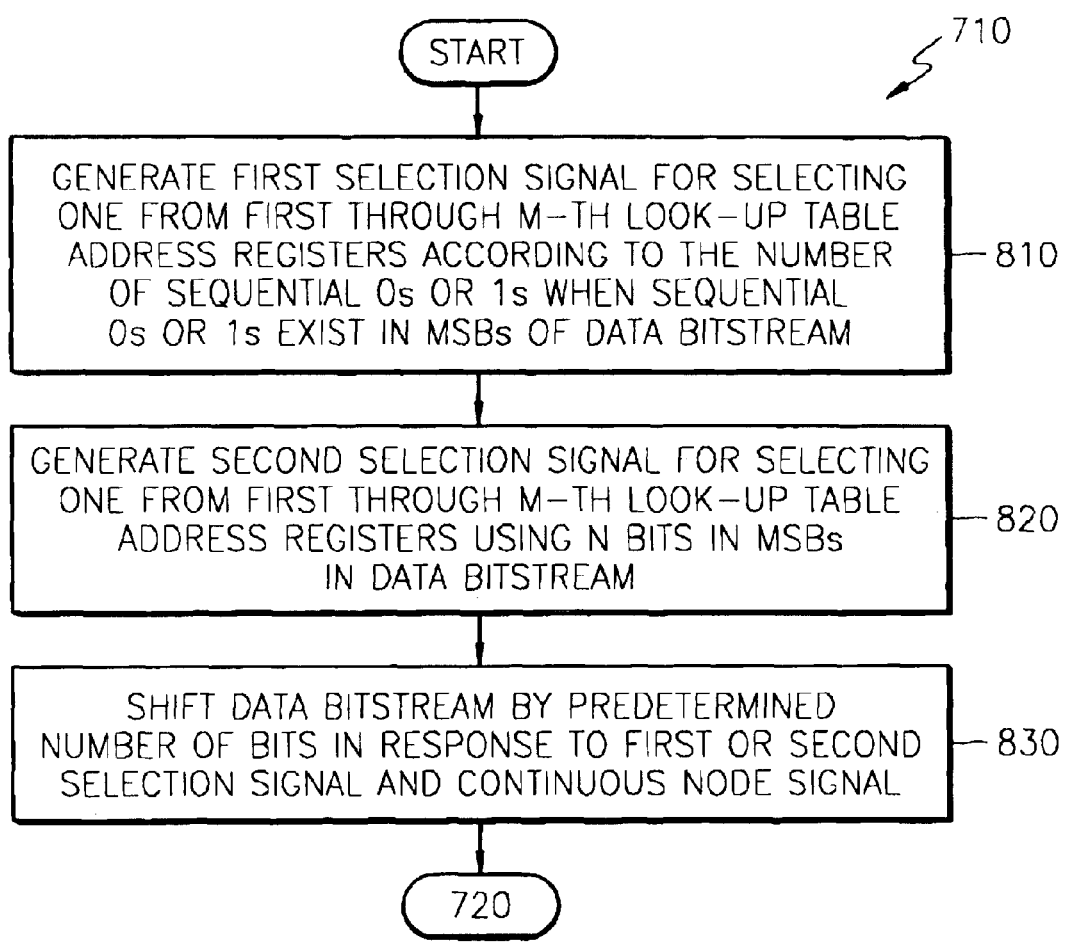
FIG. 8 is a flowchart of step 710 shown in FIG. 7.

FIG. 7 is a flowchart of a method of decoding a variable length code according to an embodiment of the present invention. FIG. 8 is a flowchart of step 710 shown in FIG. 7.

Referring to FIG. 7, a method 700 of decoding a variable length code according to an embodiment of the present invention is performed by a variable length code decoding apparatus comprising first through M-th look-up table address registers, where M is a natural number, each including a predetermined LOC address. The variable length code decoding apparatus further comprises a memory storing a LOC table containing K-bit LOC table values, where K is a natural number, corresponding to each LOC address and predetermined terminal values corresponding to each LOC address. The variable length code decoding apparatus comprises a memory searcher storing a LOC information table comprising information referred to for decoding a variable length code. In step 710 a data bitstream is received, and a first selection signal or a second selection signal for selecting a look-up table address register from a set of first through M-th look-up table address registers is generated according to a code value of the data bitstream.

More specifically, when sequential 0s or 1s exist in the MSBs of the data bitstream, the first selection signal for selecting the look-up table address register from the set of first through M-th look-up table address registers is generated according to the number of sequential 0s or 1s in step 810. The second selection signal for selecting the look-up table address register from the set of first through M-th look-up table address registers is generated using N bits, where N is a natural number, in the MSBs of the data bitstream in step 820. The data bitstream is shifted by a predetermined number of bits in response to the first selection signal or the second selection signal and a continuous node signal in step 830.

One of the outputs of the first through M-th look-up table address registers is selected in response to the first selection signal or the second selection signal in step 720.

A third selection signal for selecting a LOC table value and a terminal value corresponding to the LOC table value from the LOC table stored in the memory is generated by adding the output selected in step 710 and a predetermined next LOC address in step 730. The terminal value is used to obtain a predetermined symbol address. The predetermined next LOC address is the sum of a current LOC address and the number of non-terminal nodes existing in a current LOC up to the current node.

A LOC table value and a terminal value are selected from the LOC table in response to the third selection signal in step 740.

In step 750 it is determined whether L bits of the data bitstream designate a terminal node or a continuous node using the LOC information table based on the selected LOC table value and the selected terminal value, which are output from the memory, so as to generate a continuous node signal or a symbol address signal. The data bitstream may be shifted by 3 bits in response to the continuous node signal.

The predetermined next LOC address used for selecting the LOC table value is generated in step 730 in response to the continuous node signal in step 760.

A fourth selection signal for selecting a fixed length code is generated in response to the symbol address signal in step 770.

In response to the fourth selection signal, a fixed length code is selected from the memory and then output in step 780.

The symbol address is the sum of a terminal value corresponding to a current LOC table and the number of terminal nodes in a current LOC before a current node. The LOC information table stored in the memory searcher is the same as the LOC information table used by the apparatus 100 for decoding a variable length code, and thus a detailed description thereof will be omitted. A LOC table value stored in the memory comprises LOC information bits corresponding to node types, which are respectively designated by the variable length codes of a current LOC in the LOC information table. According to an embodiment of the present invention, L may be 3.

The variable length code decoding method 700 shown in FIGS. 7 and 8 corresponds to the operation of the variable length code decoding apparatus 100 shown in FIG. 1. Accordingly, a detailed description of the variable length code decoding method 700 will be omitted.

As described above, in an apparatus and method for decoding a variable length code according to the present invention, an input data bitstream is decoded in units of 3 bits, thereby increasing a decoding speed. In addition, by pre-decoding the input data bitstream according to the characteristic of a code value of the input data bitstream, the size of a table used for decoding can be reduced, thereby decreasing power consumption.

While this invention has been particularly shown and described with reference to preferred embodiments thereof in the drawings and specification, the preferred embodiments should be considered in a descriptive sense only and not for purposes of limitation. It will be understood by those skilled in the art that various changes in form and details may be made therein without departing from the spirit and scope of the invention. Therefore, the scope of the invention will be defined by the appended claims.

What is claimed is:

1. An apparatus for decoding a variable length code, comprising:

a pre-decoding unit for receiving a data bitstream and generating a first selection signal or a second selection signal for selecting a look-up table address register according to a code value of the data bitstream, wherein M is a natural number;

a shifter for shifting the data bitstream by a predetermined number of bits in response to one of the first selection signal and the second selection signal and a predetermined continuous node signal;

a set of first through M-th look-up table address registers, each look-up table address register comprising a LOC address designating a K-bit LOC table value stored in a memory, wherein K is a natural number;

a selector for selecting an output of the first through M-th look-up table address registers and outputting a selected output in response to one of the first selecting signal and second selection signal;

a memory controller for receiving the output of the selector, generating a third selection signal for selecting a LOC table value and a terminal value corresponding to the LOC table value in response to the predetermined continuous node signal, or generating a fourth selection signal for selecting a predetermined fixed length code stored in the memory in response to a predetermined symbol address signal, wherein the LOC table value and the terminal value are stored in the memory, and the terminal value is used to obtain a predetermined symbol address;

a memory for storing LOC table values, terminal values, and fixed length codes, outputting a LOC table value and a terminal value in response to the third selection signal, and outputting a fixed length code in response to the fourth selection code; and a memory searcher for receiving the LOC table value and the terminal value that are output from the memory and L-bits of the data bitstream, determining whether the L bits of the data bitstream designate a terminal node or a continuous node using a LOC information table stored therein, generating a continuous node signal or a symbol address signal based on a result of the determination, receiving the fixed length code output from the memory, and outputting the fixed length code, wherein L is a natural number.

2. The apparatus of claim 1, wherein the pre-decoding unit comprises:

a first pre-decoder for receiving the data bitstream and when sequential 0s or 1s exist in a set of most significant bits (MSBs) of the data bitstream, generating the first selection signal for selecting the look-up table address register from the set of first through M-th look-up table address registers according to a number of sequential 0s or 1s; and a second pre-decoder for receiving the data bitstream and generating the second selection signal for selecting the look-up table address register from the set of first through M-th look-up table address registers using N bits in the set of MSBs of the data bitstream, wherein N is a natural number.

3. The apparatus of claim 1, wherein the shifter shifts the data bitstream by 3 bits in response to the predetermined continuous node signal.

4. The apparatus of claim 1, wherein the memory controller comprises:

an offset register for receiving the selected output and storing the selected output until a next selected output is received from the selector;

an adder for generating the third selection signal for selecting values from a LOC table stored in the memory by adding an output of the offset register and a predetermined next LOC address;

a LOC address register for generating the predetermined next LOC address in response to the continuous node signal; and a symbol address register for generating the fourth selection signal for selecting the fixed length code in response to the symbol address signal.

5. The apparatus of claim 4, wherein the next LOC address is a sum of a current LOC address and a number of non-terminal nodes in a current LOC up to a current node.

6. The apparatus of claim 1, wherein the predetermined symbol address is a sum of a terminal value corresponding to a current LOC table value and a number of terminal nodes in a current LOC before a current node.

7. The apparatus of claim 1, wherein the LOC information table stored in the memory searcher comprises node types indicating whether a node designated by the variable length code is a terminal node, a continuous node, or an invalid node, each node type comprising $N*2^L$ LOC information bits, and LOC information bits for each node type are expressed using four formats A, B, C, and D, each format comprising N bits.

8. The apparatus of claim 7, wherein in the LOC information table stored in the memory searcher, when the variable length code is 0, 1, 00, 01, 10, or 11, a node type designated by the variable length code is a terminal node; and when the variable length code is one of 000 through 111, a node type designated by the variable length code is one of the terminal node, the continuous node, and the invalid node, and wherein in a case where N is 2 and L is 3, when the variable length code is 0, an upper 8 bits of the LOC information bits are expressed as ABBB; when the variable length code is 1, a lower 8 bits of the LOC information bits are expressed as ABBB; when the variable length code is 00, an upper 4 bits of the LOC information bits are expressed as AB; when the variable length code is 01, the LOC information bits from an upper fifth to eighth places are expressed as AB; when the variable length code is 10, the LOC information bits from an upper ninth to twelfth places are expressed as AB; when the variable length code is 11, the LOC information bits from an upper thirteenth to sixteenth places are expressed as AB; and when the variable length code is one of 000 through 111, LOC information bits for a terminal node designated by the variable length code are expressed as A, LOC information bits for a continuous node designated by the variable length code are expressed as C, and LOC information bits for an invalid node designated by the variable length code are expressed as D.

9. The apparatus of claim 7, wherein in the LOC information table stored in the memory searcher, when the variable length code is 0 or 1, a node type designated by the variable length code is a terminal node; and when the variable length code is one of 00 through 11, a node type designated by the variable length code is one of the terminal node, the continuous node, and the invalid node, and wherein in a case where N is 2 and L is 2, when the variable length code is 0, an upper 4 bits of the LOC information bits are expressed as AB; when the variable length code is 1, a lower 4 bits of the LOC information bits are expressed as AB; and when the variable length code is one of 00 through 11, LOC information bits for the terminal node designated by the variable length code are expressed as A, LOC information bits for the continuous node designated by the variable length code are expressed as C, and LOC information bits for the invalid node designated by the variable length code are expressed as D.

10. The apparatus of claim 1, wherein each LOC table value stored in the memory comprises LOC information bits corresponding to node types designated by each variable length code of a current LOC in the LOC information table.

11. The apparatus of claim 1, wherein the selector is a multiplexer.

12. A method of decoding a variable length code using a variable length code decoding apparatus comprising a set of first through M-th look-up table address registers each look-up table address register comprising a predetermined LOC address, the variable length code decoding apparatus comprising a memory storing a LOC table, which comprises K-bit LOC table values corresponding to each LOC address and predetermined terminal values corresponding to each LOC address, and fixed length codes, and the variable length code decoding apparatus comprising a memory searcher storing a LOC information table comprising information referred to for decoding a variable length code, wherein M is a natural number and K is a natural number, the method comprising:

(a) receiving a data bitstream and generating one of a first selection signal and a second selection signal for selecting a look-up table address register from the set of the first through M-th look-up table address registers according to a code value of the data bitstream;

(b) selecting an output of the first through M-th look-up table address registers in response to one of the first selection signal and the second selection signal;

(c) generating a third selection signal for selecting a LOC table value and a terminal value corresponding to the LOC table value from the LOC table stored in the memory by adding the output selected in step (b) and a predetermined next LOC address, the terminal value being used to obtain a predetermined symbol address;

(d) selecting the LOC table value and the terminal value from the LOC table in response to the third selection signal;

(e) determining whether L bits of the data bitstream designates a terminal node or a continuous node using the LOC information table based on the selected LOC table value and the selected terminal value, which are output from the memory, to generate a continuous node signal or a symbol address signal, wherein L is a natural number;

(f) generating the predetermined next LOC address used for selecting the LOC table value in response to the continuous node signal;

(g) generating a fourth selection signal for selecting a fixed length code in response to the symbol address signal; and (h) selecting a fixed length code from the memory and outputting the fixed length code, in response to the fourth selection signal.

13. The method of claim 12, wherein step (a) comprises:

(a1) when sequential 0s or 1s exist in a set of most significant bits (MSBs) of the data bitstream, generating the first selection signal for selecting the first through M-th look-up table address register according to the number of sequential 0s or 1s;

(a2) generating the second selection signal for selecting one from the first through M-th look-up table address register using N bits in the set of MSBs of the data bitstream, wherein N is a natural number; and (a3) shifting the data bitstream by a predetermined number of bits in response to one of the first selection signal and the second selection signal and the continuous node signal.

14. The method of claim 12, wherein the next LOC address is a sum of a current LOC address and a number of non-terminal nodes in a current LOC up to a current node.

15. The method of claim 12, wherein the symbol address is a sum of a terminal value corresponding to a current LOC table value and a number of terminal nodes in a current LOC before a current node.

16. The method of claim 12, wherein the LOC information table stored in the memory searcher comprises node types indicating whether a node designated by the variable length code is a terminal node, a continuous node, or an invalid node, each node type comprising $N*2^L$ LOC information bits, and LOC information bits for each node type are expressed using four formats A, B, C, and D, each format comprising N bits.

17. The method of claim 16, wherein in the LOC information table stored in the memory searcher, when the variable length code is 0, 1, 00, 01, 10, or 11, a node type designated by the variable length code is a terminal node; and when the variable length code is one of 000 through 111, a node type designated by the variable length code is one of the terminal node, the continuous node, and the invalid node, and wherein in a case where N is 2 and L is 3, when the variable length code is 0, an upper 8 bits of the LOC information bits are expressed as ABBB; when the variable length code is 1, a lower 8 bits of the LOC information bits are expressed as ABBB; when the variable length code is 00, an upper 4 bits of the LOC information bits are expressed as AB; when the variable length code is 01, the LOC information bits from an upper fifth to eighth places are expressed as AB; when the variable length code is 10, the LOC information bits from an upper ninth to twelfth places are expressed as AB; when the variable length code is 11, the LOC information bits from an upper thirteenth to sixteenth places are expressed as AB; and when the variable length code is one of 000 through 111, LOC information bits for a terminal node designated by the variable length code are expressed as A, LOC information bits for a continuous node designated by the variable length code are expressed as C, and LOC information bits for an invalid node designated by the variable length code are expressed as D.

18. The method of claim 16, wherein in the LOC information table stored in the memory searcher, when the variable length code is 0 or 1, a node type designated by the variable length code is a terminal node; and when the variable length code is one of 00 through 11, a node type designated by the variable length code is one of the terminal node, the continuous node, and the invalid node, and wherein in a case where N is 2 and L is 2, when the variable length code is 0, an upper 4 bits of the LOC information bits are expressed as AB; when the variable length code is 1, a lower 4 bits of the LOC information bits are expressed as AB; and when the variable length code is one of 00 through 11, LOC information bits for the terminal node designated by the variable length code are expressed as A, LOC information bits for the continuous node designated by the variable length code are expressed as C, and LOC information bits for the invalid node designated by the variable length code are expressed as D.

19. The method of claim 12, wherein each LOC table value stored in the memory comprises LOC information bits corresponding to node types designated by each variable length code of a current LOC in the LOC information table.

* * * * *